United States Patent
Hintze et al.

(10) Patent No.: US 7,531,418 B2
(45) Date of Patent: May 12, 2009

(54) METHOD OF PRODUCING A CONDUCTIVE LAYER INCLUDING TWO METAL NITRIDES

(75) Inventors: Bernd Hintze, Langebrueck (DE); Stephan Kudelka, Dresden (DE); Jonas Sundqvist, Dresden (DE)

(73) Assignee: Qimonda AG, Munich (DE)

( * ) Notice: Subject to any disclaimer, the term of this patent is extended or adjusted under 35 U.S.C. 154(b) by 94 days.

(21) Appl. No.: 11/296,568

(22) Filed: Dec. 8, 2005

(65) Prior Publication Data
US 2006/0128128 A1    Jun. 15, 2006

(30) Foreign Application Priority Data
Dec. 10, 2004  (DE) .......................  10 2004 059 668

(51) Int. Cl.
*H01L 21/20*    (2006.01)

(52) U.S. Cl. .............................. 438/393; 257/E21.396; 438/396

(58) Field of Classification Search .................. 438/243, 438/656, 393, 396; 257/E21.396
See application file for complete search history.

(56) References Cited

U.S. PATENT DOCUMENTS

| | | | |
|---|---|---|---|
| 6,399,457 B2 * | 6/2002 | Park et al. | 438/393 |
| 6,569,759 B2 * | 5/2003 | Taguwa | 438/629 |
| 6,900,498 B2 * | 5/2005 | Stauf et al. | 257/310 |
| 2002/0014647 A1 * | 2/2002 | Seidl et al. | 257/301 |
| 2002/0086111 A1 * | 7/2002 | Byun et al. | 427/255.394 |
| 2002/0140102 A1 * | 10/2002 | Pan et al. | 257/762 |
| 2003/0003648 A1 | 1/2003 | Song | |
| 2003/0060003 A1 | 3/2003 | Hecht et al. | |
| 2005/0037612 A1 * | 2/2005 | Goda et al. | 438/637 |
| 2005/0101132 A1 * | 5/2005 | Kim et al. | 438/687 |
| 2006/0011587 A1 * | 1/2006 | Shea | 216/96 |

FOREIGN PATENT DOCUMENTS

| | | |
|---|---|---|
| JP | 2002/329680 A | 11/2002 |
| JP | 2003/524888 T | 8/2003 |
| JP | 2003/273350 A | 9/2003 |

* cited by examiner

*Primary Examiner*—Asok K Sarkar
(74) *Attorney, Agent, or Firm*—Eschweiler & Associates, LLC

(57) ABSTRACT

In a method for producing a conductive layer a substrate is provided. On the substrate, a layer includes at least two different metal nitrides. In one embodiment, on a surface of the substrate a first metal nitride layer is deposited, followed by a second metal nitride layer formed thereon. A third metal layer is then deposited on a surface of the second metal nitride layer.

19 Claims, 1 Drawing Sheet

METHOD OF PRODUCING A CONDUCTIVE LAYER INCLUDING TWO METAL NITRIDES

BACKGROUND OF THE INVENTION

1. Field of the Invention

The present invention relates to a semiconductor technology process for producing a conductive layer.

2. Description of the Related Art

Although the present invention is described in connection with the fabrication of capacitors in semiconductor substrates, the invention is not restricted to this particular application, but rather relates in general terms to the production of thin conductive layers.

For reasons which are generally known, in semiconductor technology it is preferred to use processes which allow the highest possible integration density of semiconductor components. Capacitors represent one example of semiconductor components which are very frequently required, in particular for semiconductor memory components. To fabricate capacitors, trenches with a high aspect ratio are typically etched into a semiconductor substrate, and a first electrode, an insulation layer and a second electrode are successively deposited on the trench base and the trench side walls. The typical capacitor shapes are named according to the sequence of the individual layers deposited in the trenches and include, for example, an MIM (metal insulator metal) capacitor or an MIS (metal insulator semiconductor) capacitor. The capacitance of the capacitor is proportional to the surface area of the insulation layer. To enable the capacitance to be as high as possible, the first electrode must be as thin as possible in the trench, in particular in the region of the trench base. One known material for the first electrode is titanium nitride. Titanium nitride has a tendency to grow at the trench base with a vertical grain structure. The typical size of these grain structures is about 5 nm. Layers which are of the same thickness as the size of the grain structures have grain boundaries which run from an upper surface to a lower surface of the layer. Impurities can diffuse along these grain boundaries during the semiconductor fabrication process. Typical impurities include chlorine or oxygen. These impurities lead to intermediate states in the semiconductor substrate. These intermediate states localize charge carriers and in this way lead to parasitic capacitances. Since these parasitic capacitances need to be avoided, the diffusion has to be suppressed, and therefore the minimum layer thickness of the titanium nitride has to be selected to be significantly larger than the grain structure of titanium nitride, i.e. 5 nm.

As described above, further layers are then deposited on the titanium nitride layer. It is found in this context that the quality of the layers subsequently deposited depends to a considerable extent on the roughness of the surface of the titanium nitride layer. Thin titanium nitride layers give rise to a mean roughness of about 1 nm, on account of the grain structure. The result of this is that further layers are deposited on a thin titanium nitride layer of low quality, or a high level of outlay is required for the deposition of these layers.

SUMMARY OF THE INVENTION

It is an object of the present invention to provide a semiconductor technology process which allows the deposition of a thin conductive layer, the surface of this layer having a low roughness. A further object of the present invention is to provide a process which allows deposition of a thin conductive layer which does not have any continuous grain boundaries.

The object is achieved in accordance with the invention by means of a semiconductor process for producing a conductive layer, in which a layer comprising at least two different metal nitrides is deposited on a substrate.

An advantage of the present invention is that a second metal nitride layer prevents the formation of grain structures in the first metal nitride layer or at least reduces the size of the grain structures.

In a restricted version of the inventive process, the substrate is provided, and a first metal nitride layer is deposited on a surface of the substrate, a second metal nitride layer is deposited on the surface of the first metal nitride layer, and a third metal nitride layer is deposited on the surface of the second metal nitride layer. In this case, the middle, second metal nitride layer prevents the formation of large grain structures in the first and third metal nitride layers.

The metal nitride layers may be deposited by means of an ALD process. The first metal nitride layer may include titanium nitride.

Preferably, the second metal nitride layer may include hafnium nitride. It has been found that even a thin hafnium nitride layer suppresses the formation of large grain structures in the titanium nitride. The second metal nitride layer may in this case be less than 5 nm thick and preferably less than 1 nm thick. The first and/or third metal nitride layers may now be less than 10 nm thick, on account of the reduced size of the grain structure. At least one of the metal nitride layers may simultaneously include hafnium nitride and titanium nitride.

Exemplary embodiments of the invention and advantageous refinements are illustrated in the figures of the drawings and explained in more detail in the description which follows.

DESCRIPTION OF THE DRAWINGS

In the figures, identical reference numerals denote identical or functionally equivalent components, unless stated otherwise.

FIG. 1 illustrates a capacitor structure in a semiconductor substrate 10. A trench 1 has been etched into the semiconductor substrate, which typically includes silicon or silicon oxide. The trench 1 advantageously has a high aspect ratio, i.e. a low width combined with a great depth. The capacitor is formed in the trench by a first conductive layer 11 being deposited in the trench, subsequently forming the first electrode. An insulating layer 12, preferably with a high dielectric constant, is deposited on this first electrode. Then, a second conductive layer 13 is deposited on the insulating layer 12 in order to form the second electrode. Finally, the trench can be filled with a semiconductor substrate, preferably a highly doped semiconductor substrate. The capacitance of the capacitor rises with increasing surface area of the insulating layer 12 between the two electrodes. The thinner the first conductive layer 11, the larger the surface area of the insulating layer 12 becomes, approaching the surface area of the trench 1.

FIG. 2 illustrates an exemplary embodiment of the present invention. The conductive layer 11 illustrated in FIG. 1 is composed of a titanium nitride layer 23, a hafnium nitride layer 22 and a second titanium nitride layer 21, which are deposited on a substrate 10 in the order listed. The titanium nitride layers 21, 23 are approximately 4 nm to 5 nm thick. It has been found that with this layer sequence, surprisingly no grain structures are formed in the titanium nitride, or the grain structure has a significantly smaller dimension than what is typically formed in pure titanium nitride with a dimension of approximately 5 nm. Consequently, the titanium nitride layer can be deposited with a lower layer thickness without the formation of continuous grain boundaries running from one surface to a second surface. Therefore, the titanium nitride layer forms a diffusion barrier to impurities, such as chlorine or oxygen. Another effect of the smaller grain structures of the titanium nitride is that on average a smoother surface is formed. The surface roughness of the layers (FIG. 2) with a total thickness is about one third lower than the surface roughness of a pure titanium nitride layer with a thickness corresponding to the total thickness mentioned above. Therefore, the dielectric layer 12 and the second conductive layer 13 can be deposited more evenly on the layer sequence comprising the titanium nitride layer, the hafnium nitride layer 22 and the titanium nitride layer 21 having the improved surface property than on a pure titanium nitride layer.

Figure 1:
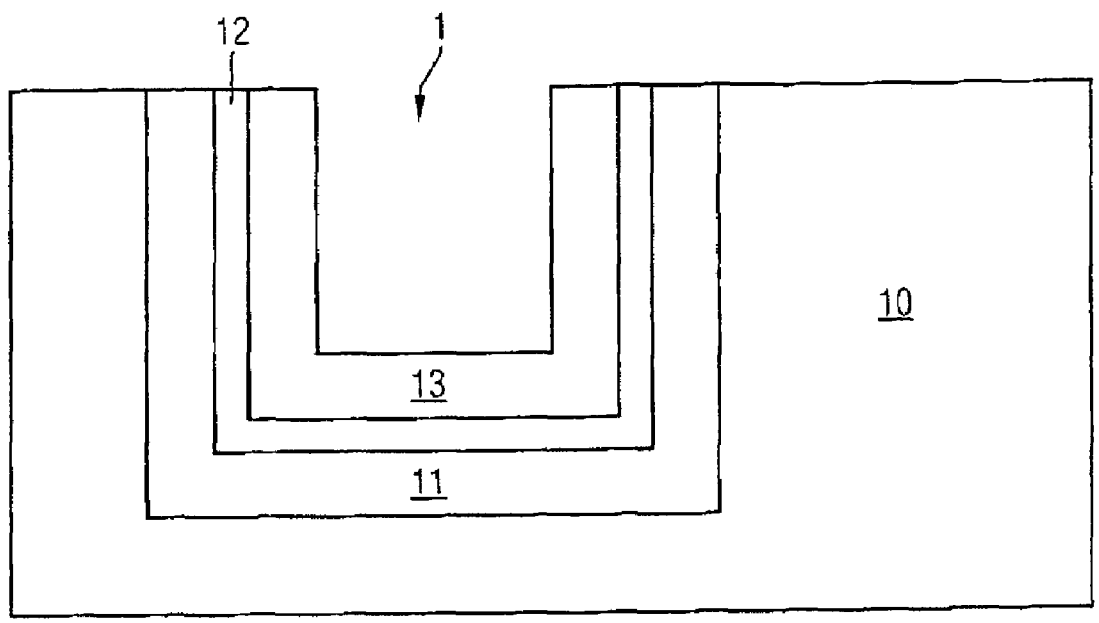
FIG. 1 is a layer structure of a capacitor.
Figure 2:
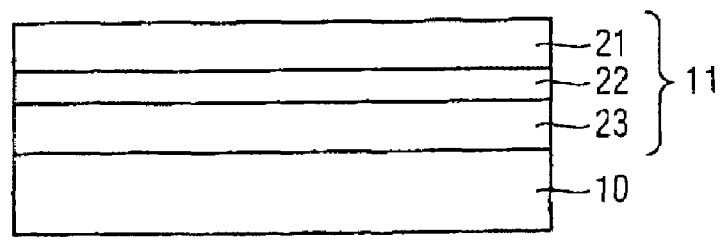
FIG. 2 is an exemplary embodiment of the present invention.

Another exemplary embodiment of the present invention provides for deposition of a hafnium nitride layer on a titanium nitride layer followed by deposition of a titanium nitride layer on a hafnium nitride layer to be repeated a number of times.

A third exemplary embodiment of the present invention provides for hafnium nitride and titanium nitride to be deposited simultaneously on the semiconductor substrate. A mixing ratio of two thirds titanium nitride to one third hafnium nitride is preferred. The advantage of the third embodiment over the process described above is its simpler process control compared to the layer growth. The mixed titanium-hafnium nitride layer has a surface roughness which is one fifth lower than a titanium nitride layer of similar thickness.

It has advantageously been found that the above mentioned titanium-hafnium nitride layers are stable with respect to annealing steps at a temperature of 1050° C. for at least 60 seconds. This allows the process steps of the three embodiments to be integrated in existing semiconductor technology processes.

Although the present invention is described with reference to preferred exemplary embodiments, the invention is not restricted to these exemplary embodiments.

In particular, the invention is not restricted to being used for the fabrication of a first electrode of an MIM capacitor. A person skilled in the art will use the process according to the invention whenever thin conductive layers with a low surface roughness are required.

Preferred deposition processes for applying the thin metal nitride layers include an ALD (atomic layer deposition) process and a CVD (chemical vapor deposition) process. In particular the former process allows a layer to be deposited with a predetermined thickness in the range of a few nanometers.

A hafnium nitride layer is preferred in the embodiments. This can be replaced, with appropriate modifications, by a layer which includes a different metal nitride. Likewise, the layer thicknesses are only examples, and in particular may be less than the sizes indicated.

Although modifications and changes may be suggested by those skilled in the art, it is the intention of the inventors to embody within the patent warranted heron all changes and modifications as reasonably and properly come within the scope of their contribution to the art.

We claim as our invention:

1. A method for producing a capacitor, comprising the steps of:
   providing a substrate;
   depositing, on a surface of said substrate, a first conductive layer comprised of at least two different metal nitrides by depositing two of the at least two metal nitrides simultaneously on the substrate, to form a first electrode;
   depositing a dielectric layer on the first electrode; and
   depositing a second conductive layer on the dielectric layer to form a second electrode.

2. The method of claim 1, wherein the at least two different metal nitrides deposited simultaneously on the substrate forms a layer that comprises at least two different metals as the first conductive layer.

3. The method of claim 1, wherein two of the at least two different metal nitrides comprise hafnium nitride and titanium nitride formed simultaneously on the substrate.

4. The method of claim 3, wherein the hafnium nitride and the titanium nitride are deposited in a ratio of two thirds titanium nitride to one third hafnium nitride.

5. A method for producing a capacitor, comprising the steps of:
   providing a first substrate;
   depositing a first conductive layer over the first substrate to form a first electrode;
   depositing a dielectric layer on the first electrode; and
   depositing a second conductive layer on the dielectric layer to form a second electrode;
   wherein the deposition of the first conductive layer comprises the steps:
   depositing a first metal nitride layer on a surface of said substrate;
   depositing a second metal nitride layer on a surface of said first metal nitride layer, wherein the second metal nitride layer directly contacts the first metal nitride layer, and wherein the first and second metal nitride layers are different from one another; and
   depositing a third metal nitride layer on a surface of said second metal nitride layer, wherein the third metal nitride layer directly contacts the second metal nitride layer, and wherein the second and third metal nitride layers are different from one another.

6. The method of claim 5, comprising depositing said first, second and third nitride layers of the first electrode by means of an ALD process.

7. The method of claim 5, wherein said first metal nitride layer comprises titanium nitride.

8. The method of claim 7, wherein said second metal nitride layer comprises hafnium nitride;
   the chemical composition of said third metal nitride layer corresponds to the chemical composition of said first metal nitride layer; and
   the first and third metal nitride layer comprising titanium nitride containing no grain structures.

9. The method of claim 8, wherein the first and third metal nitride layers are less than 5 nm thick and the second metal nitride layer is less than 1 nm thick.

10. The method of claim 5, wherein said second metal nitride layer comprises hafnium nitride.

11. The method of claim 5, wherein the chemical composition of said third metal nitride layer corresponds to the chemical composition of said first metal nitride layer.

12. The method of claim 5, comprising repeating the steps of depositing said second metal nitride layer on said surface of said first metal nitride layer and depositing said third metal nitride layer on said surface of said second metal nitride layer.

13. The method of claim 5, wherein at least one of said first, second or third metal layers is less than 5 nm thick.

14. The method of claim 5, wherein at least one of said first, second or third metal layers is less than 1 nm thick.

15. The method of claim 5, wherein at least one of said first, second, or third metal nitride layers comprises hafnium nitride and titanium nitride.

16. The method of claim 5, wherein a second substrate is deposited over the second conductive layer.

17. The method of claim 16, wherein first and third metal nitride layers are less than 5 nm thick and the second metal nitride layer is less than 1 nm thick.

18. The method of claim 17, wherein the mean surface roughness of the first metal nitride layer is less than 1 nm.

19. The method of claim 18, wherein the mean surface roughness of the third metal nitride layer is less than 1 nm.

* * * * *